US005469483A

United States Patent [19]

Inoue et al.

[11] Patent Number: 5,469,483

[45] Date of Patent: Nov. 21, 1995

[54] TIMER WITH A COMPENSATION VALUE TO INCREMENT OR DECREMENT A COUNT VALUE OF A COUNTER

[75] Inventors: Hideo Inoue; Mitsuru Sugita, both of Itami, Japan

[73] Assignee: Mitsubishi Denki Kabushiki Kaisha, Tokyo, Japan

[21] Appl. No.: 273,167

[22] Filed: Jul. 25, 1994

[30] Foreign Application Priority Data

Sep. 9, 1993 [JP] Japan .................................... 5-224393

[51] Int. Cl.$^{6}$ ........................... H03K 21/02; H03K 21/40

[52] U.S. Cl. ................................. 377/20; 377/49; 377/54; 377/55; 327/262; 327/265

[58] Field of Search ................................. 377/49, 54, 20, 377/55; 327/262, 265

[56] References Cited

U.S. PATENT DOCUMENTS 4,225,824 9/1980 Sekine et al. ........................... 377/110
4,267,575 5/1981 Bounds ..................................... 377/49
4,638,498 1/1987 Sinniger .................................... 377/49
5,222,111 6/1993 Muramatsu ............................... 377/49
5,276,722 1/1994 Aoki et al. ................................ 377/49

*Primary Examiner*—John S. Heyman
*Attorney, Agent, or Firm*—Lowe, Price, LeBlanc & Becker

[57] ABSTRACT

A timer has a function of compensation calculation and includes a compensation value register 1 for holding a compensation value and an arithmetic unit 2 which adds or subtracts a compensation value "α" held in the compensation value register 1 and a value "CC" of a count value C of a counter 3 at that time point, and by loading the operation result of the arithmetic unit 2 to the counter 3. Such a timer reduces a burden on a CPU and is capable of compensating the count value correctly regardless of a remaining time.

14 Claims, 13 Drawing Sheets

TIMER WITH A COMPENSATION VALUE TO INCREMENT OR DECREMENT A COUNT VALUE OF A COUNTER

FIELD OF THE INVENTION

This invention relates to a timer, and in particular, to a timer capable of compensating a counting time during the time-counting operation thereof.

DESCRIPTION OF RELATED ART

A timer, which is built-in a microcomputer or the like, does not time-count by itself generally, but counts the internal clocks of constant frequency, thereby being so constructed as to time-count substantially.

FIG. 1 is a block diagram example showing a configuration of a conventional timer.

In the FIG. 1, reference numeral 90 designates a CPU, 3 a counter, and 91 a control circuit which controls an object to be controlled in accordance with a count value of the timer.

In addition to controlling the timer and outputting a load value LV to the counter 3, the CPU 90 reads a count value C of the counter 3 when necessary to compensate the counter 73 and loads a new value after the compensation to the counter 3.

In this example, if the counter 3 is a down-counter, and when the count value C does not underflow, the A clock signal CLK is given from a clock source to the counter 3 (not shown) When a value "A" is loaded as a load value LV from the CPU 90, the counter 3 makes the value A be an initial value of the count value C and starts counting down with the clock signal CLK as a count source. The count value C of the counter 3 is sent to the CPU 90 as well as to the control circuit 91. When the count value C from the counter 3 is not, for example, "0" the control circuit 91 outputs a signal "1" (high level) and after it reaches "0" and underflows, the circuit 91 outputs a signal of "0" (low level), thereby to generate a pulse signal PS. The pulse signal PS outputted from the control circuit 91 is utilized for controlling a various kinds of objects, for example, a fuel injection of a vehicle engine.

In the following, explanation will be given on such an example referring to the drawings.

FIG. 2 is a schematic diagram showing a configuration of a suction system for a general internal combustion engine.

In FIG. 2, reference numeral 70 designates an internal combustion engine which sucks air through an air flow sensor (AFS) 73 being a Karman vortex flowmeter, a throttle valve 72, a surge tank 71, and a suction pipe 75, and the fuel is supplied by an injector 74. The exhaust air from the internal combustion engine 70 is outputted through an exhaust pipe 76.

FIG. 3 is a block diagram showing an outline configuration of a control system for supplying fuel to the internal combustion engine 70 shown in FIG. 2.

In FIG. 3, a control unit 80 adjusts a fuel supply quantity based on output signals of the AFS 73, a water temperature sensor, a crank angle sensor 77, an idle switch 78 which detect idle states of the throttle valve 72, and the like through an interface 81, and controls the driving period of four injectors 74 provided at the respective cylinders of the internal combustion engine 70.

The control unit 80 includes a microcomputer 83 having a ROM 84, a RAM 85., the CPU 90, a clock generator 86 for generating the clock signal CLK, and the like, the interface 81, and a timer 87.

The timer 87 counts down the number of clocks of the clock signal CLK generated by the clock generator 86 from the value given from the microcomputer 83.

Brief explanation will be made on the operation of the control system of such an engine.

The CPU 90 of the microcomputer 83 decides the driving period of the injectors 74 on the basis of the respective input signals from the interface 81. Explanation of the logic is omitted because there is not a particular relation between the present invention and the logic.

When the CPU 90 of the microcomputer 83 decides the driving period of the injectors 74, it sets the number of clocks of the clock signal CLK corresponding thereto to the timer 87 as an initial value.

The timer 87 counts down with a value which has been set by the CPU 90 as an initial value and with a clock signal CLK generated by the clock generator 86 as a count source. The timer 87 generates a pulse signal PS which drives the injector 74 by outputting a high level signal while the count value C does not underflow, and by outputting a low level signal after the count value C reaches "0" and underflows.

As mentioned above, the timer 87 counts down with a value given from the CPU 90 as an initial value of the counter 3 and outputs the pulse signal PS corresponding to the count value C, and it is of course possible to change a clock value of the timer 87.

When a new load value LV is given from the CPU 90 during the counting operation, the counter 3 continues to count down by substituting the count value C at that time with the newly given load value LV. In other words, the CPU 90 is capable of extending or shortening a period in which the control circuit 91 outputs a signal "1", that is, of changing a width of the pulse signal PS, by compensating the count value C at that time of the counter 3 to be another value as occasion demands.

FIG. 4 is a timing chart showing a relationship between the count value C of a conventional timer and the pulse signal PS outputted from the control circuit 91. The figure shows the relationship between the state of the count value C of the counter 3 when the counter 3 compensates the count value. C during the counting operation and extends the clock value and the pulse signal PS outputted from the control circuit 91 at that time.

In addition, in FIG. 4, the count value C is shown in the axis of ordinate and time in the axis of abscissa.

The pulse signal PS outputted from the control circuit 91 becomes high level when the count value C of the counter 3 does not underflow, and becomes low level after the count value C of the counter 3 reaches "0" and underflows. In other words, a period in which the count value C of the counter 3 does not underflow corresponds to a counting time of the timer 87.

In the following, a detailed explanation will be made referring to FIG. 4.

As shown by a solid line, when a value "A" is loaded as an initial value of the count value C at a time point tO, the counter 3 counts down from the initial value "A" with the clock signal CLK being as a count source, and the count value C becomes "0" at a time point t3.

During a period P1 which the counter 3 requires for counting down from the initial value "A" to "O" from the time point tO to the time point t3, the control circuit 91 outputs the pulse signal PS at a high level.

If the value "A" is newly loaded as the initial value of the count value C to the counter 3 at the time point tO, and the counter 3 counts down from the initial value A with the clock signal CLK being as a count source, there may be a necessity, at a time point t1, to extend a high level period of the pulse signal PS outputted by the control circuit 91 by a period P2 to a time point t4.

In other words, the CPU 90 judges that there is a necessity to extend the driving period of the injector 74 in a control system shown in FIG. 3.

In such a case, it is proper for the CPU 90 to load newly to the counter 3 a value obtained by adding the count value C of the counter 3 corresponding to the period P2, that is, the number of clocks of the clock signal CLK, which the counter 3 counts down during the period P2, as a compensation value "α", to the count value "CC" of the counter 3 at the time point t1. Thereby, as shown by a broken line, the time-counting value of the timer is extended to the time point t4.

In the case where the CPU 90 reads the count value "CC" at the time point t1 from the counter 3, performs the aforementioned addition, and loads the resultant value "CC +α" to the counter 3 as the load value LV, and since the operation is generally performed in synchronism with clocks in the CPU 90, some period (some number of clocks) are required for the CPU 90 to execute the aforementioned series of processings.

At the time point t2, at which the CPU 90 loads the new value "CC +α" to the counter 3, the count value C of the counter 3 has been already counted down by "β" from the time point t1 at which the CPU 90 started reading and becomes "CC–β". When "CC +α" is newly loaded as the count value C of the counter 3 at the time point t2, at which the count value C of the counter 3 has been "CC–β", as shown by a dashed line, the counting operation of the counter 3 is further extended by the period P3 corresponding to the value "β" and the count value C becomes "O" at the time point t5.

In other words, since the result is same as the case where "CC +α+β" is loaded to the counter 3 at the time point t1 at which the count value C of the counter 3 is "CC", right compensation can't be performed.

Accordingly, in order to avoid such a situation, there is a necessity for performing a compensation which estimates the value "β" in advance, and therefore, the CPU 90 operates as follows.

At first, the CPU 90 reads the count value "CC" of the counter 3 at the time point t1 at which a compensation is performed. Next, the CPU 90 adds an original compensation value "α" to the count value "CC" which has been read, to obtain the value "CC +α". Further, the CPU 90 obtains a value "CC +α–β" obtained by subtracting the value "β" from the value "CC +α" and loads the value "CC +α–β" to the counter 3 at the time point t2 to finish the compensation.

According to such an operation, since a newly loaded value "CC +α–β" is substituted for the count value "CC –β" being the value at the time point t2 at which a new value is actually loaded to the counter 3, the fact shows that the value "α" has been added to the count value C of the counter 3.

After this, the counter 3 starts counting down again, as shown by a broken line in FIG. 4, from the newly loaded value "CC +α–β" at the time point t2. Hence, the high level period of the output signal PS of the control circuit 91 is extended, as shown by hatching in FIG. 4, by a period P2 necessary for counting down of the value "α" by the counter 3. IN other words, the time-counting value of the timer is extended by the period P2.

According to the conventional timer, since such a series of operations as aforementioned were necessary for compensating the count value correctly during the counting operation of the counter, the CPU is required to rewrite the count value of the counter with regard to a period necessary for the CPU's executing the compensation calculation besides the compensation value to be newly loaded to the counter, therefore the burden of the software aspect of the CPU was heavy. There was also a problem that the compensation can be executed only when there was more than a period left for calculating a compensation.

SUMMARY OF THE INVENTION

The present invention has been devised in consideration of such circumstances, and the object thereof is to provide a timer capable of reducing the burden of the CPU as well as of executing the compensation of the count value correctly anytime during time-counting operation of the timer.

The timer related to the invention is basically capable of extending or shortening the clocking time value by adding or subtracting an optional compensation value after giving it directly to the count value while the counter is counting thereby reducing the count value of the counter. Therefore, the timer is provided with a register for writing a compensation value from outside and holding it, and with an arithmetic unit for adding or subtracting the compensation value held in the register and the count value of the counter at that time point. The timer itself is so configurated as to have a function of compensation calculating by loading the result of the arithmetic operation of the arithmetic unit to the counter.

A timer of the first embodiment is provided with respectively one counter, register, and arithmetic unit.

A timer of the second embodiment is provided with a plurality of counters, one register, one arithmetic unit, and selecting means for selecting any one of the plurality of counters so as to connect it to the arithmetic unit.

A timer of the third embodiment is provided with a plurality of counters, one register, a plurality of arithmetic units corresponding respectively to the plurality of counters, and selecting means for selecting any one of the plurality of the-arithmetic units so as to connect to the register.

A timer of the fourth embodiment is provided with one counter, a plurality of registers which are respectively capable of holding in advance compensation values being different from each other, one arithmetic unit, and selecting means for selecting any one of the plurality of registers so as to connect to the arithmetic unit.

A timer of the fifth embodiment is provided with a plurality of counters, a plurality of registers which are respectively capable of holding in advance compensation values being different from each other, one arithmetic unit, and selecting means for selecting any one of the plurality of registers and any one of the plurality of counters so as to connect them as a set to the arithmetic unit.

In the timer related to the invention, basically, the compensation value written from the outside to the register are held therein and the count value of the counter are added or subtracted by the arithmetic unit, and the value of this arithmetic operation result is newly loaded as the count value to the counter, and the counter continues to count from the value.

In the first embodiment, when the compensation value is inputted to the register during the counting by the counter, the compensation result held in this register and the count value of the counter are added or subtracted by the arithmetic unit, and the value of the result is newly loaded to the counter as the count value, and the counter continues to count from the value.

According to the second embodiment, when the compensation value is inputted to the register during the counting by the counter, the compensation value held in the register and the count value of the counter selected by the selecting means are added or subtracted by the arithmetic unit, and the value of the result is newly loaded as the count value to the selected counter, and the counter continues to count from the value.

According to the third embodiment, when the compensation value is inputted to the register during the counting by the counter, the compensation value held in the register is given to the arithmetic unit which is selected by the selecting means. Also to the arithmetic unit, a count value of the counter which is selected thereto is given and added or subtracted therein and the value of the result is newly loaded as the count value to the counter, and the counter continues to count from the value.

According to the fourth embodiment, the compensation values are respectively held in a plurality of registers in advance, and a compensation value is given to the arithmetic unit from a register selected by the selecting means when the counter is counting, and to the arithmetic unit, a count value of the counter is given and added or subtracted therein, and a value of the result is newly loaded as the count value to the counter, and the counter continues to count from the value.

According to the fifth embodiment, the compensation values are respectively held in a plurality of registers in advance, and a compensation value is given to the arithmetic unit from a register selected by the selecting means when a plurality of counters are counting, and to the arithmetic unit, a count value of the counter selected by the selecting means is given and added or subtracted therein, and a value of the result is newly loaded as the count value to the counter, and the counter continues to count from the value.

The above and further objects and features of the invention will more fully apparent from the following detailed description with accompanying drawings.

DESCRIPTION OF THE PREFERRED EMBODIMENTS

In the following explanation will be made in detail on the present invention referring to drawings showing the embodiments thereof.

Figure 5:
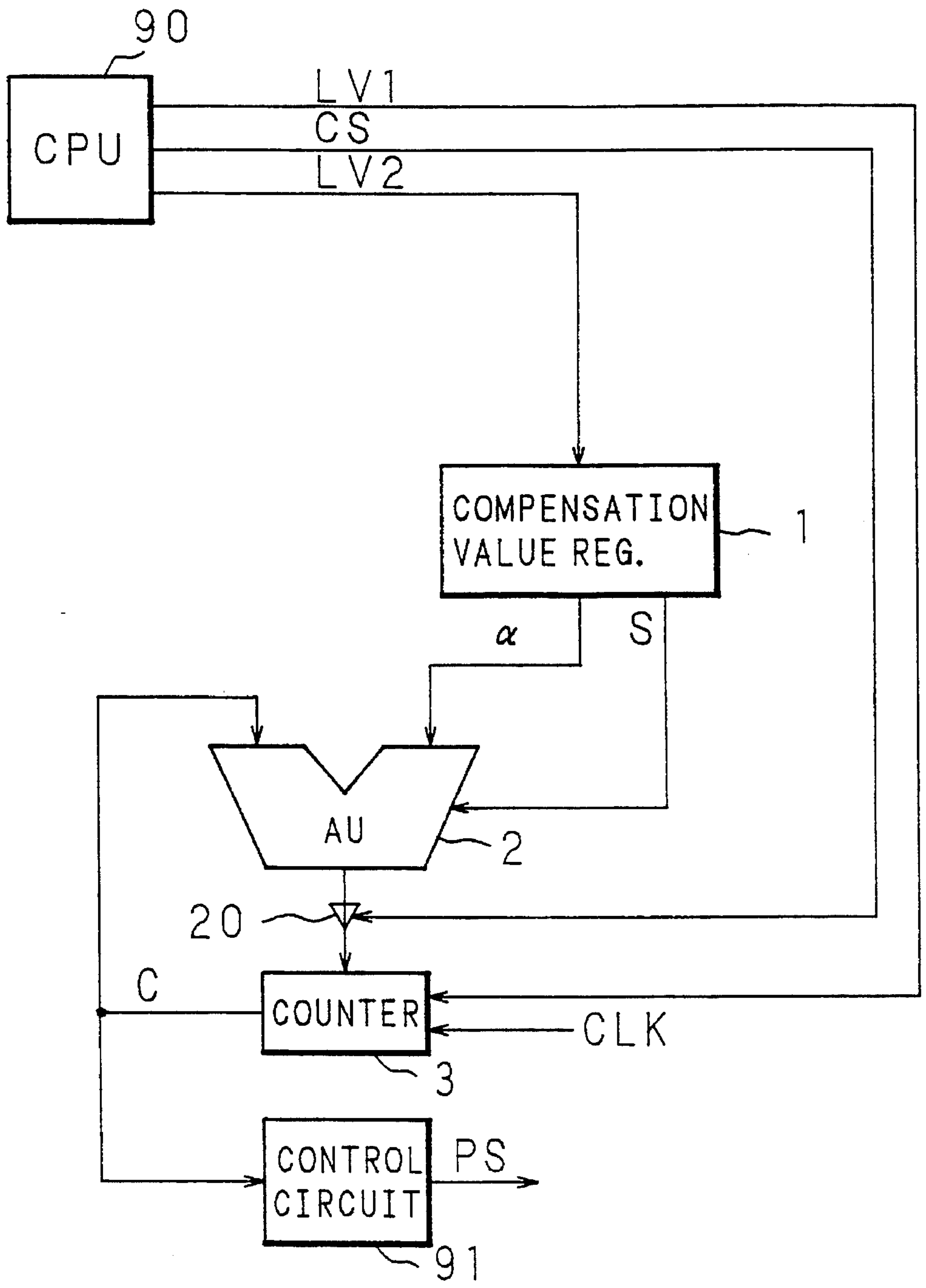
FIG. 5 is a block diagram showing a configuration of a counting unit of the first embodiment of a timer related to the invention.

FIG. 5 is a block diagram showing an outline configuration of the first embodiment of a timer related to the invention.

Figure 1:
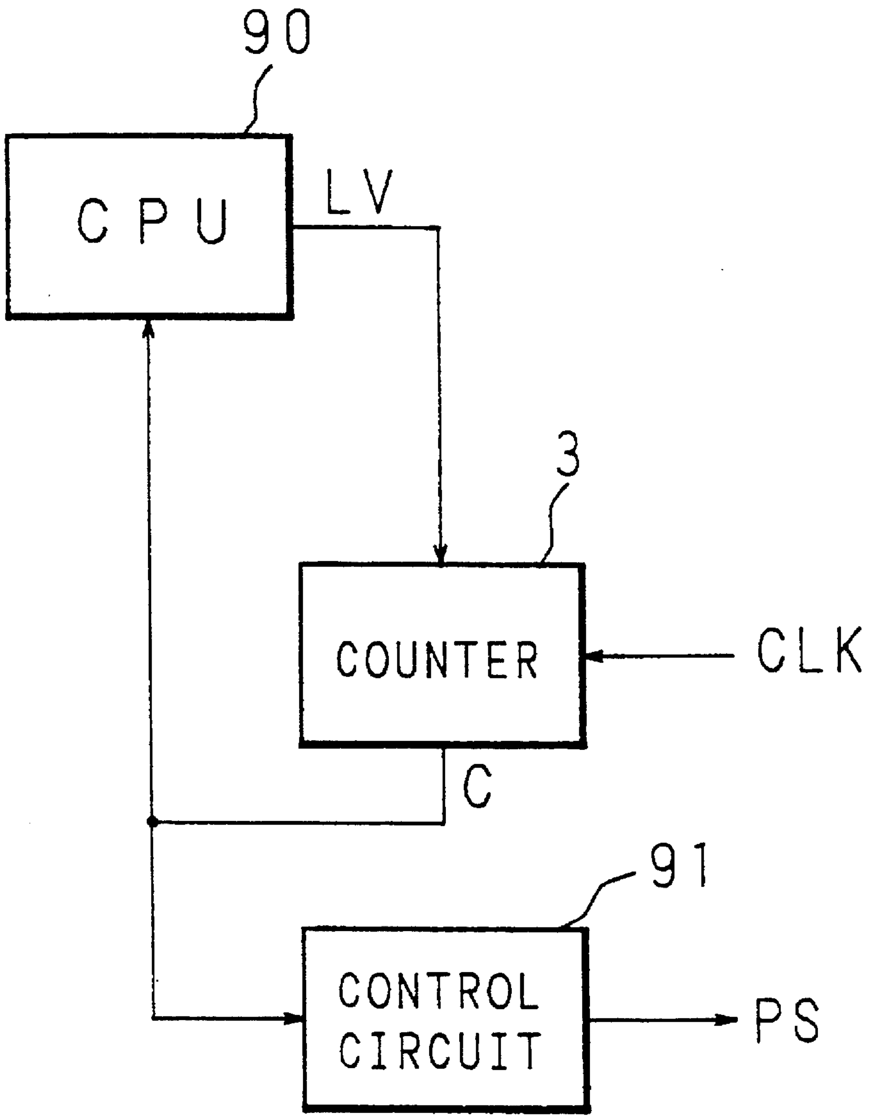
FIG. 1 PRIOR ART
FIG. 1 is a block diagram showing an example of a configuration of the counting unit of a conventional timer.
Figure 2:
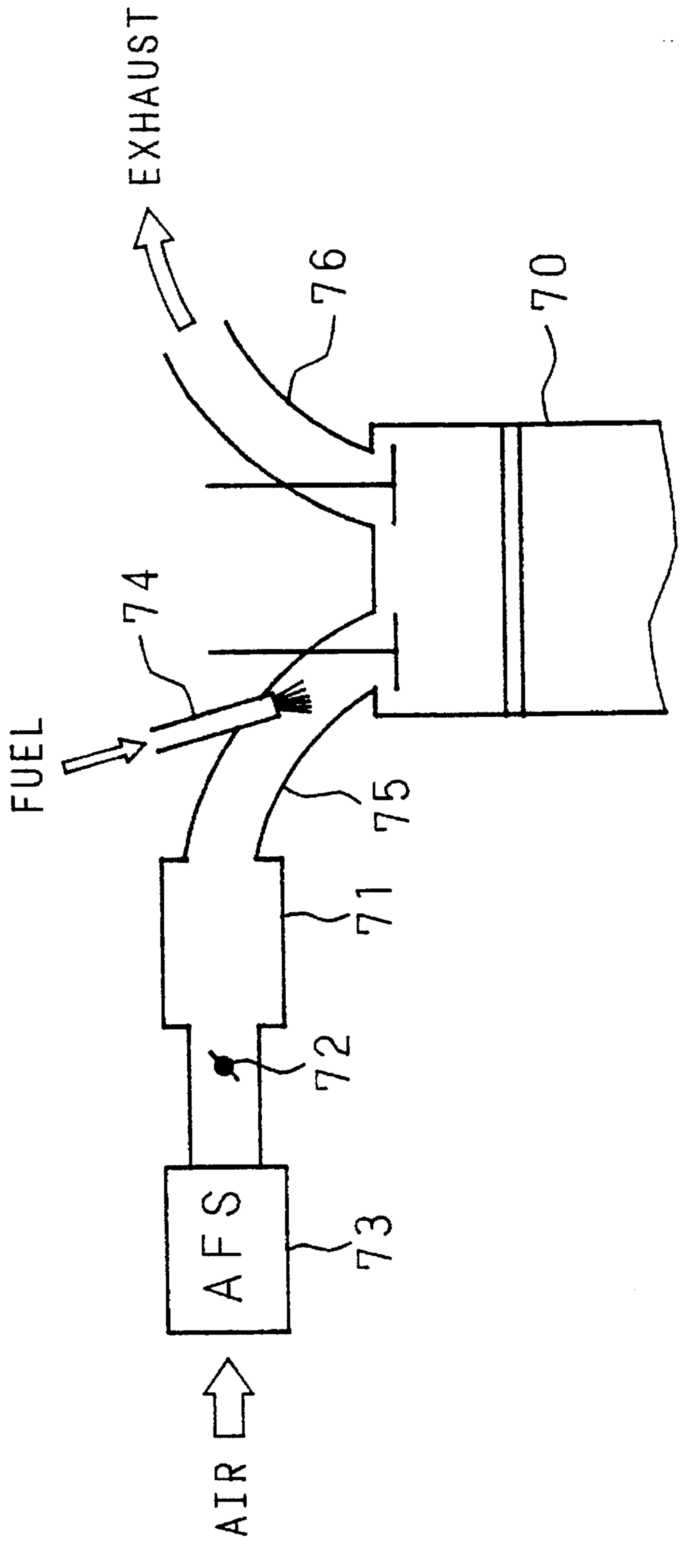
FIG. 2 PRIOR ART
FIG. 2 is a schematic diagram showing a configuration of a suction system for a general internal combustion engine as an example in which a conventional timer is used.
Figure 3:
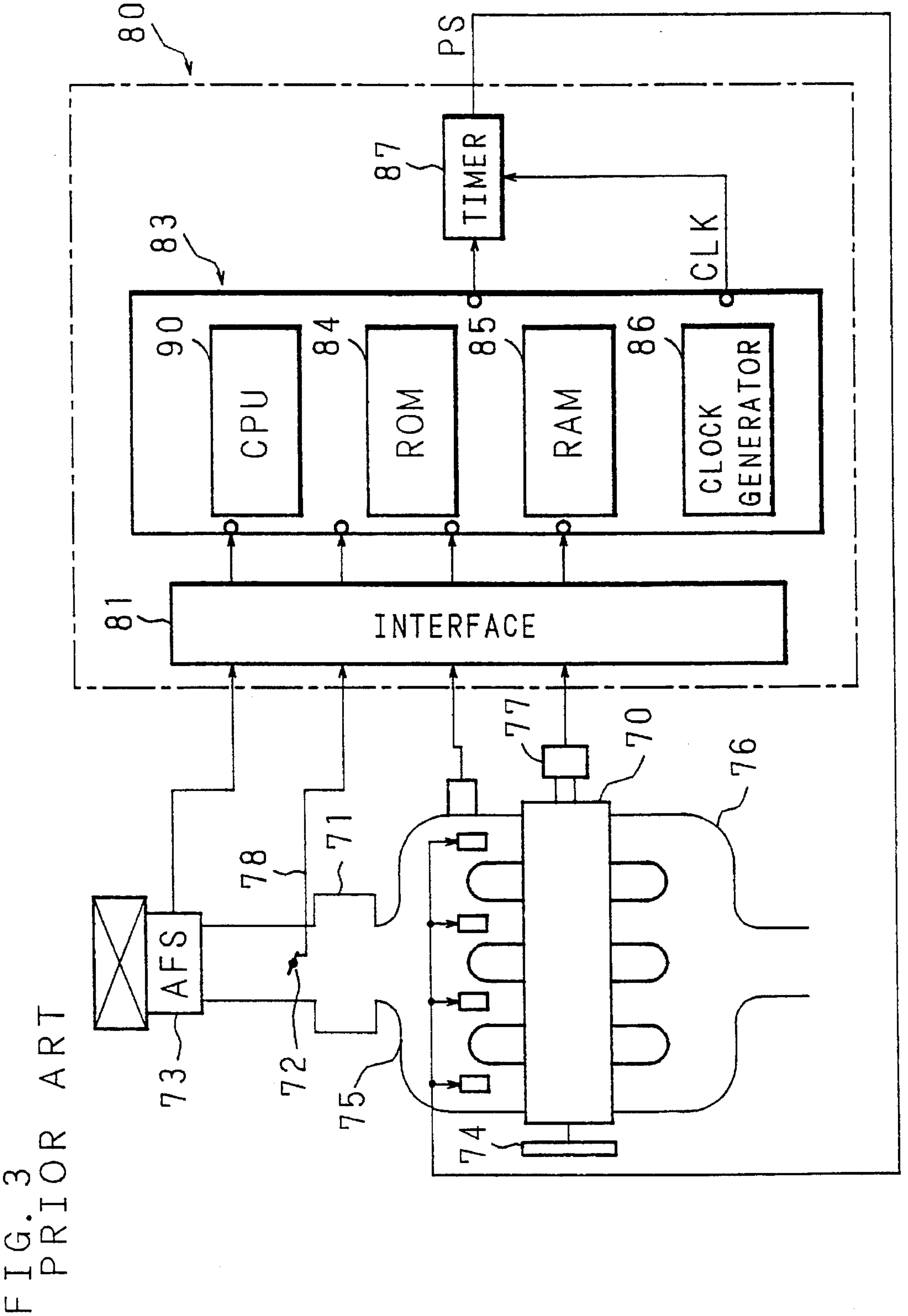
FIG. 3 PRIOR ART
FIG. 3 is a block diagram showing an outline configuration for supplying fuel to a general internal combustion engine as an example in which a conventional timer is used.
Figure 4:
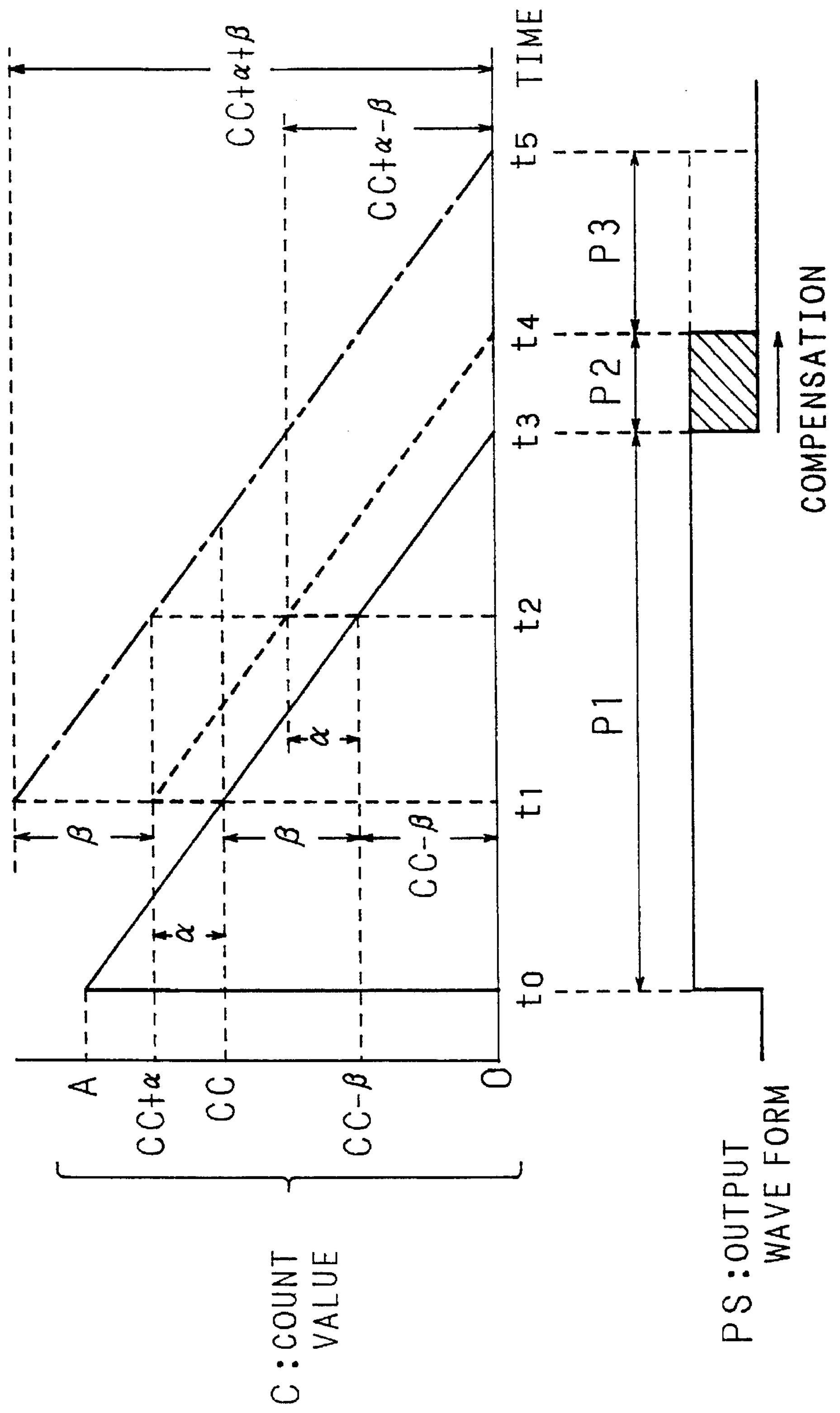
FIG. 4 PRIOR ART
FIG. 4 is a timing chart explaining an operation of a counter of a conventional timer, in which the count value of the counter is shown in the axis of ordinate and the time is shown in the axis of abscissa.

In addition, in FIG. 5, the same reference characters as shown in FIG. 1 referred to in the explanation of the aforesaid conventional example, show the same or the corresponding parts.

In FIG. 5, reference numeral 90 designates a CPU as a controlling means, numeral 1 a compensation value register as a holding means, 2 an arithmetic unit (an adding and subtracting unit in this embodiment) as an operating means, 3 a counter, 20 a gate interposed on a signal line from the arithmetic unit 2 to the counter 3, and 91 a control circuit controlling an object to be controlled according to the count value of the timer.

The CPU 90 controls the timer, and outputs a load value LV1 to the counter 3, a load value LV2 to the compensation value register 1, and a control signal CS to the gate 20.

The compensation value register 1 holds the load value LV2 given from the CPU 90, and outputs a compensation value $\alpha$ to one input terminal of the arithmetic unit 2 and also outputs a sign bit S.

Figure 6:
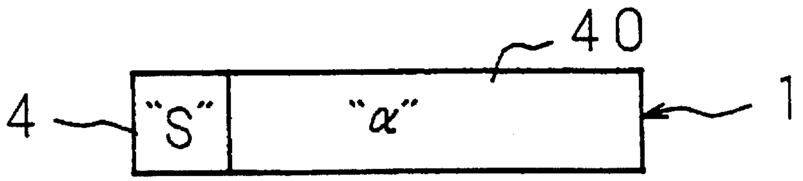
FIG. 6 is a schematic diagram showing a content of a compensation value register of the first embodiment of a timer related to the invention.

FIG. 6 is a schematic diagram showing a content of the compensation value register 1.

The compensation value register 1 includes a first area for holding a sign bit S of one bit, designated by numeral 4, and a second area 40 for holding a compensation value $\alpha$. The-load value LV2 outputted from the CPU 90 is composed of the sign bit S of one bit and a compensation value $\alpha$ of the other plural bits. As afore-described, the sign bit S is held in the first area 4 of the compensation value register 1 and the compensation value $\alpha$ is held in the second area 40 of the compensation value register 1, respectively.

The sign bit S is a bit for designating whether or not to add or subtract in the arithmetic unit 2. In the case where the counter 3 is a down counter (or up counter), the arithmetic unit 2 adds (or subtracts) when the time-counting value is extended, and subtracts (or adds) when the time-counting value is shortened. The CPU 90 sets that either adding or subtracting is designated by the sign bit S held in the second area 4 of the compensation value register 1.

To one input terminal of the arithmetic unit 2, the load value LV2(α) held in the aforesaid compensation value register 1, and to the other input terminal thereof, the count value C of the counter 3 is inputted, and moreover, the sign bit S held in the compensation value register 1 is given to the control terminal as a control signal. The arithmetic unit 2 adds or subtracts the compensation value α to/from the count value C according to the sign bit S given to the control terminal and outputs the operation result "C +α" or "C −α".

A gate 20 interposed between the arithmetic unit 2 and the counter 3 is provided so as to load the operation result "C +α" or "C −α" of the arithmetic unit 2 to the counter 3, when the control signal CS is given from the CPU 90.

If counter 3 is a down counter in this embodiment, and is so constructed as to execute counting operation when the count value C of itself does not underflow and to underflow when the count value C of itself reaches "O".

A clock signal CLK is given from a clock source to the counter 3 (not shown). When a value "A" is loaded as the load value LV1 from the CPU 90, the counter 3 starts to count down from the value "A" as an initial value of the count value C of itself and with the clock signal CLK S as the count source. As aforementioned, the count value C of the counter 3 is given to the other input terminal of the arithmetic unit 2 and the control circuit 91.

On the other hand, as aforementioned, the output of the arithmetic unit 2 is also given through the gate 20. Accordingly, when the control signal CS is outputted from the CPU 90 to open the gate 20, as the operation result of the arithmetic unit 2 is loaded to the counter 3, the counter 3 substitutes the count value "CC" at that time point with a value loaded from the arithmetic unit 2, and after that, continues to count down until it underflows, that is, the count value C of itself becomes "O".

In other words, when the counter 3 is given a new value during its counting operation through the gate 20, it continues to count down after substituting the count value "CC" at that time point with a newly given value.

In addition, the count value C of the counter 3 is also given to the control circuit 91. The control circuit 91 generates a pulse signal PS by outputting a high level signal when the count value C given from the counter 3 is, for example, not "O", and outputting a low level signal after it reaches "O". The fact that the pulse signal outputted from the control circuit 91 is utilized to various objects to be controlled, for example, to a fuel injection control of an automobile engine and the like, is same as the conventional example.

Next, explanation will be given on the operation.

Figure 7:
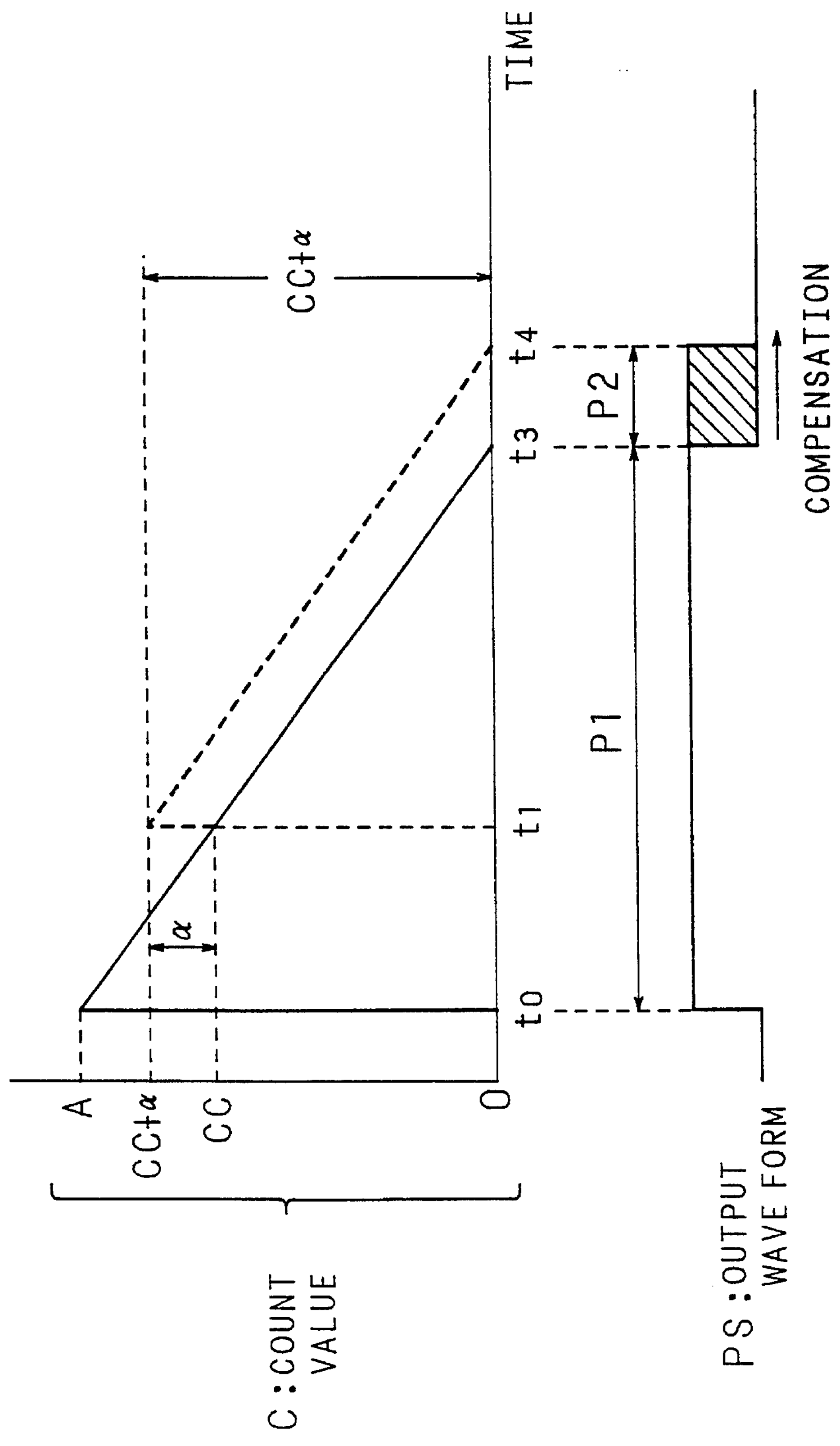
FIG. 7 is a timing chart for explaining an operation of a counter related to the first embodiment of the present invention, in which the count value of a counter is shown in the axis of ordinate and the time is shown in the axis of abscissa.

FIG. 7 is a timing chart showing a relationship between the count value C of the timer of the present invention having such a configuration as aforementioned, and the pulse signal PS outputted from the control circuit 91, in which the relation between the state of the count value C of the counter 3 at the time when the counter 3 compensates the count value C during its counting operation so as to compensate the time-counting value as the timer and the pulse signal PS outputted from the control circuit 91, being shown.

In addition, in FIG. 7, the count value C of the counter 3 is shown in the axis of ordinate and time is shown in the axis of abscissa.

The pulse signal PS outputted from the control circuit 91 becomes high level when the count value C of the counter 3 is not "O", and becomes low level after the count value C of the counter 3 reaches "O" and underflows. In other words, the period in which the count value C of the counter 3 does not underflow corresponds to the counting time of the timer.

Here, as shown by a solid line, the counter 3 counts down from an initial value "A" to "O" with the clock signal CLK as a count source when "A" is loaded as the initial value of the count value C, and the output signal PS of the control circuit 91 becomes high level during the period P1 required for the counting down Now, it is assumed that the counter 3 is in the state of underflow, and for example, the value "A" is outputted as the load value LV1 from the CPU 90 at a time point tO to be loaded as an initial value of the count value C to the counter 3. In this case, the counter 3 starts counting down the clock signal CLK as the count source from the value "A" loaded by the CPU 90 as the initial value, and underflows when the count value C becomes "O" at the time point t3.

Usually, the counter 3 operates as aforementioned, and when the load value LV1 is loaded again from the CPU 90 after the count value C underflows, the counter 3 repeats the aforementioned operation.

Accordingly, since the output signal PS from the control circuit 91 becomes high level during the counting operation of the counter 3 in the aforementioned period P1 from the time point tO to t3, and becomes low level after the counter 3 underflows at the time point t3, a fuel injection period can be controlled when the output signal PS of the control circuit 91 is utilized, for example, for an engine fuel injection control of an automobile as aforementioned.

In the following, explanation will be made referring to the timing chart in FIG. 7, on the case where the high level period of the output signal PS of the control circuit 91 is required to be extended by a period P2, at a time point t1 during the counting operation of the counter 3.

In this case, it is proper to load newly to the counter 3 a value "CC +α" obtained by adding a count value "α" of the counter 3 corresponding to the period P2, that is, the number of pulses of the clock signal CLK to be counted by the counter 3 as a compensation value during the period P2, to the count value "CC" at that time point.

A detailed explanation will be made as follows.

The CPU 90 outputs the sign bit S (for example, "1") which indicates summation and the compensation value "α" to the compensation value register 1 as the load value LV2, as well as outputs the control signal CS ( for example, "1") for opening the gate 20. The load value LV2 (α) outputted from the CPU 90 is held in the compensation value register 1 as well as is given to one input terminal of the arithmetic unit 2, and the sign bit S is given to the control terminal of the arithmetic unit 2.

At this time, since the count value "CC" at that time of the counter 3 is inputted to the other input terminal of the arithmetic unit 2, the arithmetic unit 2 executes the operation of "CC +α" to output the result.

And since the gate 20 is opened by being given the control signal CS from the CPU 90, the operation result "CC +α" by the arithmetic unit 2 is loaded to the counter 3 through the gate 20.

In addition, since the compensation value register 1, the arithmetic unit 2 and the gate 20 are not in clock synchronism with each other, the value "CC +α" is loaded to the counter 3 immediately after the compensation value "α" and the control signal CS are outputted from the CPU 90 at the time point t1.

At the counter 3, since the count value "CC" at the time point t1 is substituted with a newly loaded value "CC +α" as shown in a broken line in FIG. 7 the counter 3 continues to count down from the value "CC +α" after the time point t1 and underflows at the time point t4. Thereby, the high level period of the output signal PS of the control circuit 91 is, as shown by a hatching in FIG. 7, extended by the period P2 necessary for counting down the value "α" by the counter 3.

On the other hand, explanation will be made referring to a timing chart in FIG. 8 on the case when the high level period of the output signal PS of the control circuit 91 is shortened by the period P2 at the time point t1 during the counting operation of the counter 3.

In this case, at first, the CPU 90 outputs the sign bit S (for example, "O") which indicates subtraction and the compensation value "α" to the compensation value register 1 as the load value LV2 as well as outputs the control signal CS (for example "1") for opening the gate 20. The load value LV2 (α) outputted from the CPU 90 is held in the compensation value register 1 as well as is given to one input terminal of the arithmetic unit 2, and the sign bit S is given to the control terminal of the arithmetic unit 2.

At this time, since the count value "CC" of the counter 3 at that time is inputted to the other input terminal of the arithmetic unit 2, the arithmetic unit 2 executes the operation of "CC −α" to output its result.

And since the gate 20 is also opened by being given the control signal CS from the CPU 90, the operation result "CC −α" by the arithmetic unit 2 is loaded to the counter 3 through the gate 20.

In addition, since the compensation value register 1, the arithmetic unit 2 and the gate 20 are not in clock synchronism with each other, the value "CC −α" is loaded to the counter 3 immediately after the compensation value "α" and the control signal CS are outputted from the CPU 90 at the time point t1, is same as in the aforementioned example.

Figure 8:
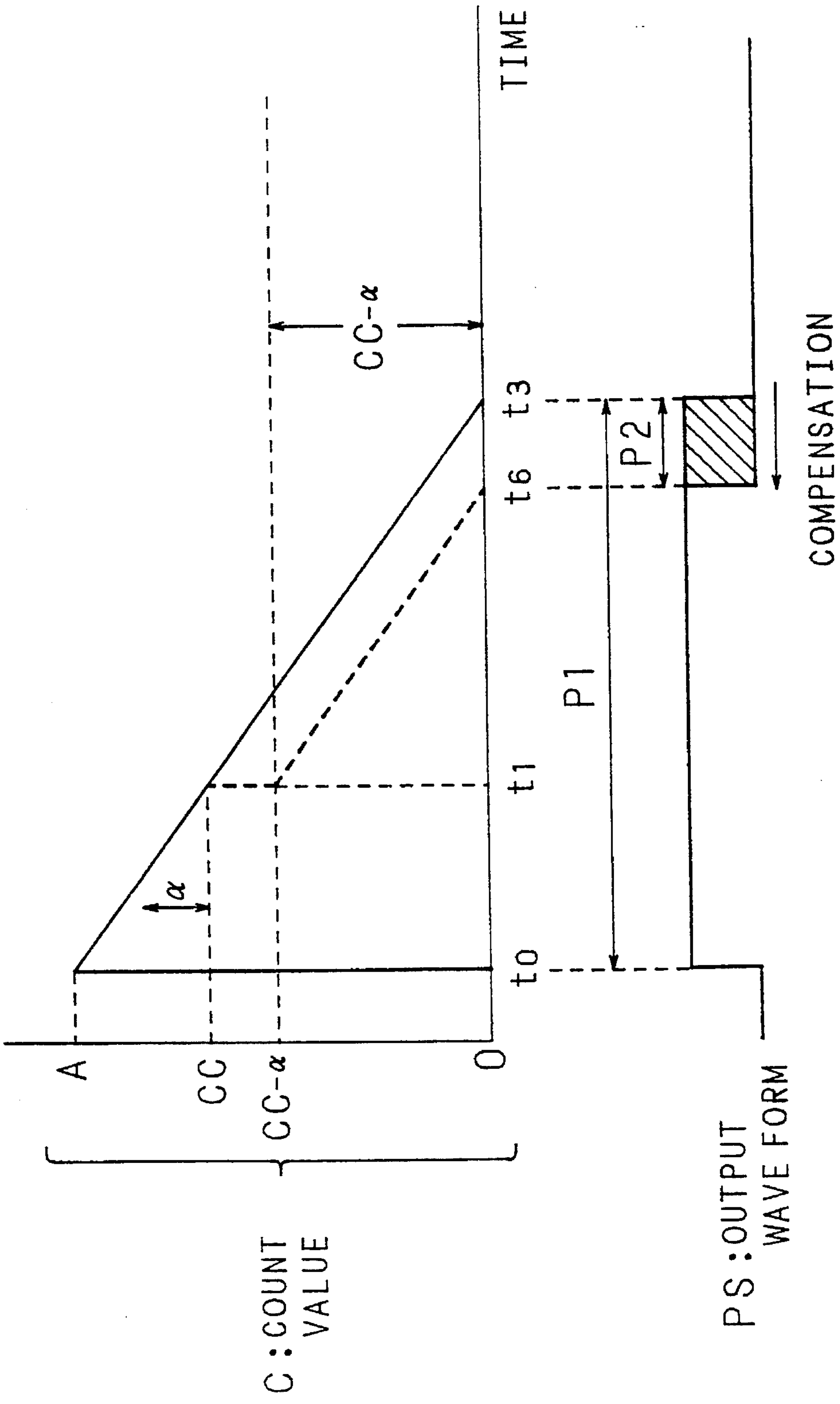
FIG. 8 is a timing chart for explaining an operation of a counter of a timer related to the first embodiment of the present invention, in which the count value of a counter is shown in the axis of ordinate and the time is shown in the axis of abscissa.

At the counter 3, since the count value "CC" at that time point t1 is substituted with a newly loaded value "CC −α", as shown in a broken line shown in FIG. 8, the counter 3 continues to count down from the value "CC −α" to the time point t6 to underflow. Thereby, the high level period of the output signal PS of the control circuit 91 is, as shown by a hatching in FIG. 8, shortened by the period P2 necessary for counting down the value "α" by the counter 3.

In addition, the subtraction is indicated to the counter 3 by the sign bit S, and in the case where borrow is generated at the time when the compensation value "α" is subtracted from the count value "CC" at that time of the counter 3, that is, when the operation result by the arithmetic unit 2 becomes negative, the load value LV1 is outputted from the CPU 90 and an initial value is newly loaded to the counter 3.

As aforementioned, according to the first invention of the present invention, when it becomes necessary to extend or shorten the time-counting value during the clocking operation of the timer, a compensation value corresponding to the extended or shortened period is not given to the counter after being added to or subtracted from the count value at that time,but it is proper only to give the compensation value to the counter directly at that time point. Therefore, in comparison with the case where the value to be given to the counter is added or subtracted in the CPU as in the conventional example, the burden of the software is lightened and the compensation is enabled whenever the counter is clocking.

Figure 9:
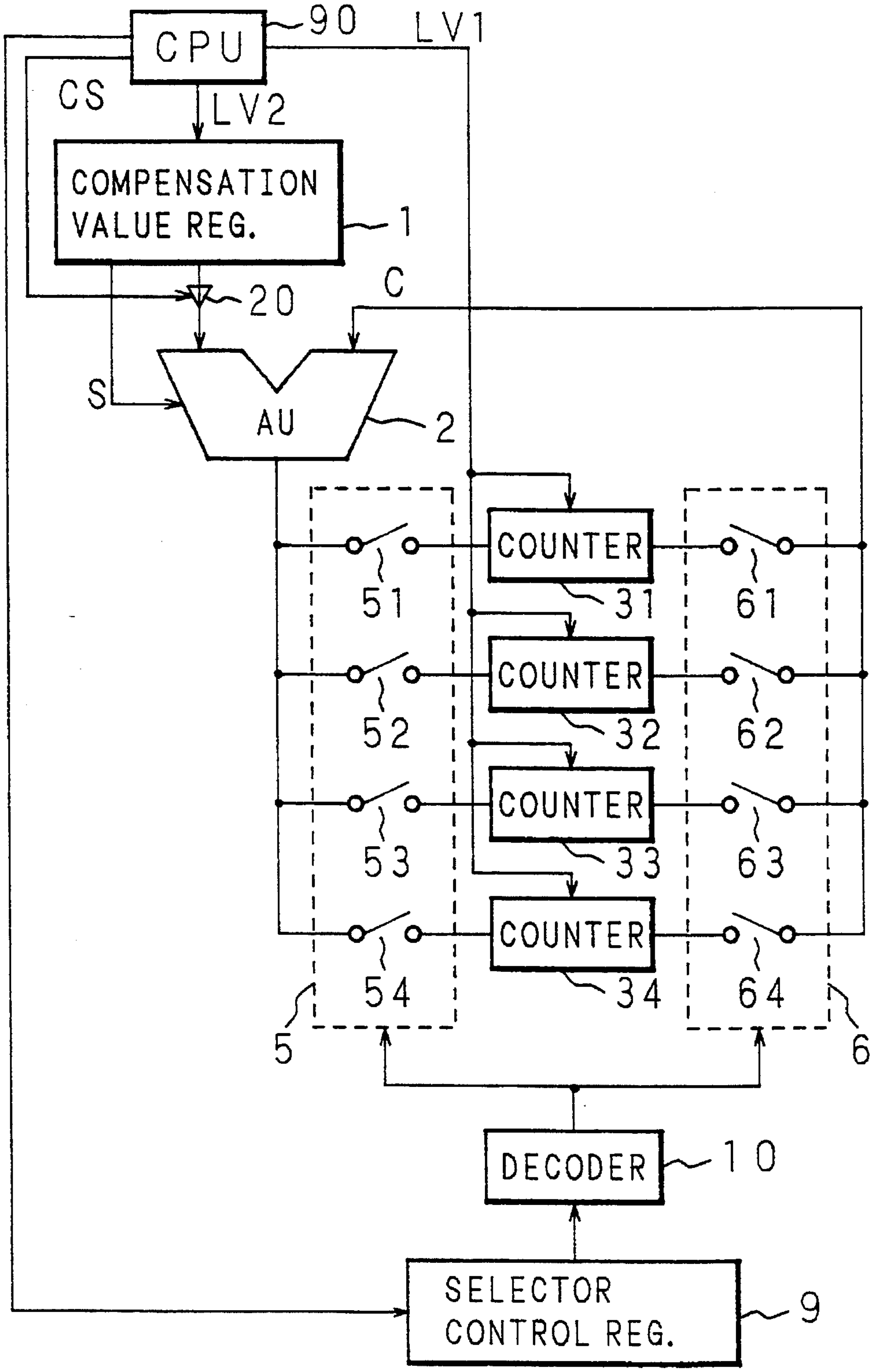
FIG. 9 is a block diagram showing a configuration of the second embodiment of a timer related to the invention.

FIG. 9 is a block diagram showing a configuration example of the second embodiment of a timer related to the invention.

According to the aforementioned first embodiment, the second embodiment includes one arithmetic unit 2 and one compensation value register 1, but includes plural counters 31, 32 . . .

Usually, a number of timers are built in a microcomputer to be used for various purposes, and the second embodiment relates to a configuration of a case where the aforementioned, first embodiment is applied by making the plural timers to be one group.

In addition, in FIG. 9, the clock signal CLK inputted to the respective counters 31, 32 . . . is omitted.

The counters are accompanied respectively by the control circuits, however, the circuits are omitted for simplicity.

A counter input selector 5 and an arithmetic unit input selector 6 for selecting with which counters 31, 32 . . . , that is, with which control circuits to connect the arithmetic unit 2, are provided.

The counter selector 5 is composed of switches 51, 52 . . . respectively corresponding to the plural counters 31, 32 . . . , and the arithmetic unit input selector 6 is composed of switches 61, 62 . . . respectively corresponding to the plural counters 31, 32 . . . As for the respective switches 51, 52 . . . of the counter input selector 5 and the respective switches 62, 62 . . . of the arithmetic unit input selector 6, the switches 51 and 61, 52 and 62 . . . corresponding respectively to the counters 31, 32 . . . are on/off at the same time.

As for the control of the respective switches 51, 52 . . . of the selector 5 and the respective switches 61, 62 . . . of the selector 6, data which designates any of the counters 31, 32, 33 . . . is set from the CPU 90 to the selector control register 9, and the switches 51 and 61 (or 52 and 62, 53 and 63 . . . ) are so made as to be on at the same time according to a signal obtained by decoding the data at the decoder 10.

By adopting such a configuration as aforementioned, when the plural timer are used as one group, it becomes possible to manage with one compensation value register and one arithmetic unit for plural counters.

According to the embodiment shown in FIG. 9, when the respective switches 51, 52 . . . and 61, 62 . . . of the counter input selector 5 and the arithmetic unit input selector 6 are configured so that all of them can be in off state, the gate 20 of the embodiment shown in FIG. 5 is not necessary.

Figure 10:
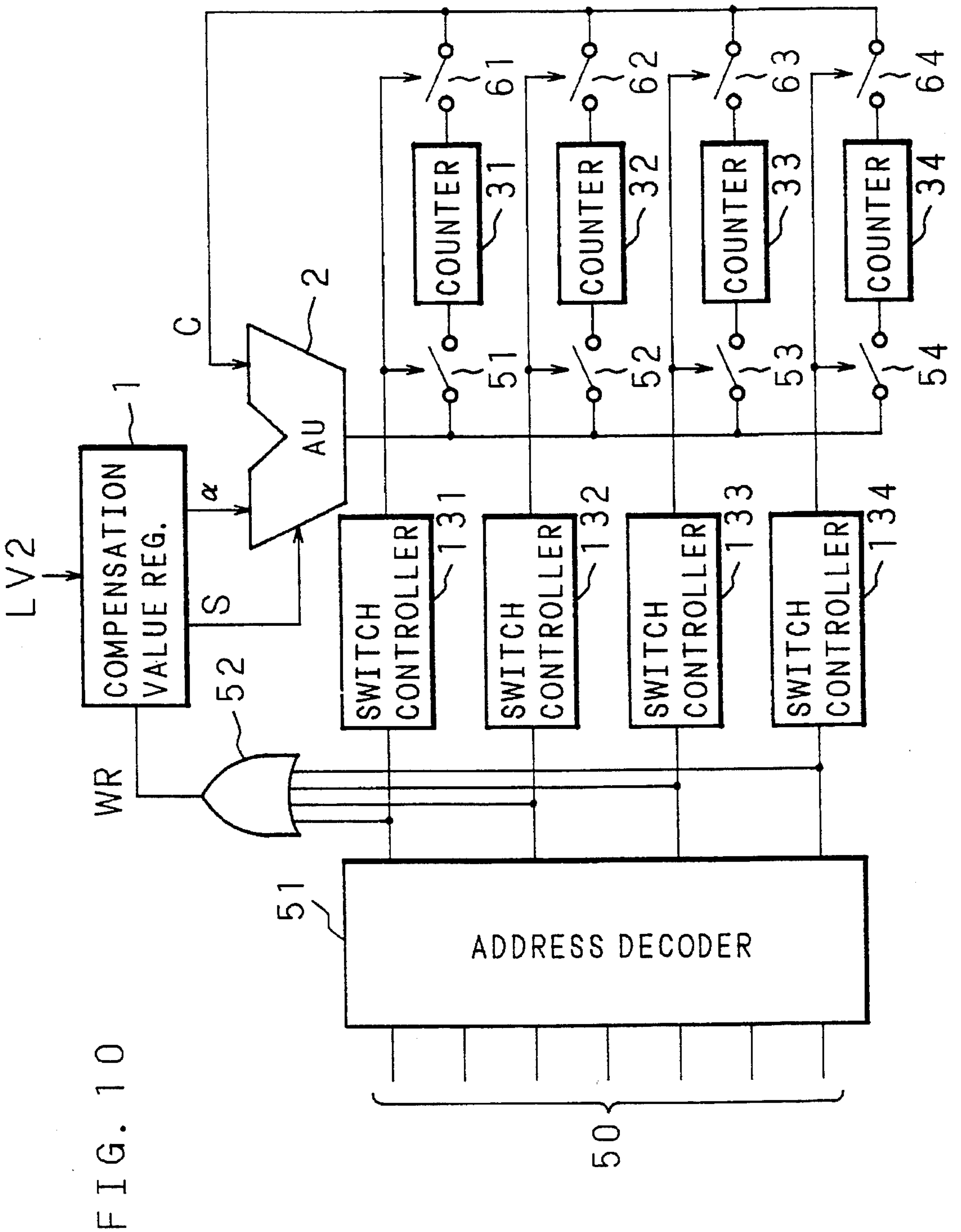
FIG. 10 is a block diagram showing a configuration variation of the second embodiment of a timer related to the present invention.

FIG. 10 is a lock diagram showing a configuration example of a variation of the second embodiment of a timer related to the invention.

In addition, in FIG. 10, the CPU 90 and the load value LV1 outputted from the CPU 90 to the respective counters 31, 32 . . . , and the clock signal CLK inputted to the respective counters 31, 32 . . . are omitted for simplicity.

Though the respective counters 31, 32 . . . are accompanied with the control circuits, the circuits are also omitted for simplicity.

In the aforesaid embodiment according to the second embodiment, the respective switches 51, 52 . . . of the counter input selector 5 and the respective switches 61, 62 . . . of the arithmetic unit input selector 6 are so constructed as to be controlled by the selector control register 9, however, it is also preferable, as in the embodiment shown in FIG. 10, to provide switch controllers 131, 132 . . . respectively corresponding to the plural counters 31, 32 . . . so as to control by them the switches 51 and 61, 52 and 62 respectively corresponding to the counters 31, 32 . . .

In addition, the switch controllers 131, 132 . . . are controlled by a signal obtained by decoding by an address decoder 51 a signal outputted by the CPU to the address bus 50 so as to designate any one of the plural counters 31, 32 . . .

When a signal, obtained by logical summing the decoded signal outputted from the address decoder 51 by an OR gate 52, is made to be a writing signal WR and the compensation value "α" is permitted to be written to the compensation value register 1 from the CPU when the writing signal is significant, the gate 20 in the embodiment shown in FIG. 5 is not necessary.

Figure 11:
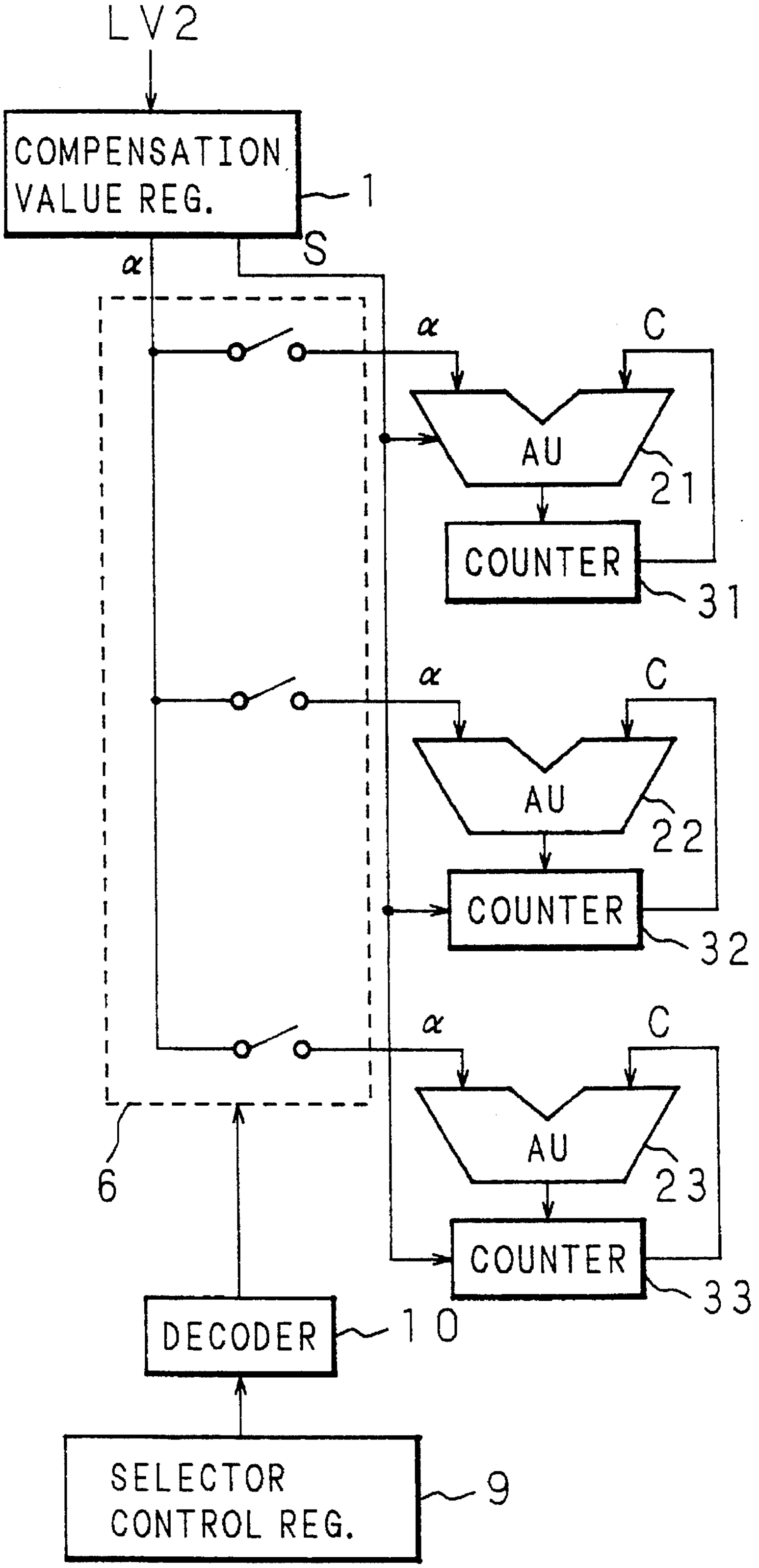
FIG. 11 is a block diagram showing a configuration of the third embodiment of a timer related to the present invention.

FIG. 11 is a block diagram showing a configuration example of a third embodiment of a timer related to the invention.

In addition, the CPU 90, the load value LV1 outputted from the CPU 90 to the respective counters 31, 32 . . . and the clock signal CLK inputted to the respective counters 31, 32 . . . are omitted for simplicity.

Though, the respective counters 31, 32 . . . are accompanied with the respective control circuits, the circuits are also omitted for simplicity.

According to the third embodiment, the arithmetic units are provided to the plural counters 31, 32 respectively by one, and the compensation value "α" set in one compensation value register 1, is selectively inputted to any one of the respective arithmetic unit 21, 22 . . . by the selector 6.

In such a configuration of the third invention, there is a necessity to provide the arithmetic units 21, 22, 23 . . . respectively corresponding to the counters 31, 32, 33 . . . , however, since it is possible to make the respective counters 31, 32, 33 . . . and the respective arithmetic units 21, 22, 23 . . . be a set to be constructed on an LSI, the flexibility of layout at the time of constructing an actual circuit becomes higher in comparison with the configuration shown in FIG. 9 and FIG. 10, and the number of the timers on the LSI can be easily changed at need.

Figure 12:
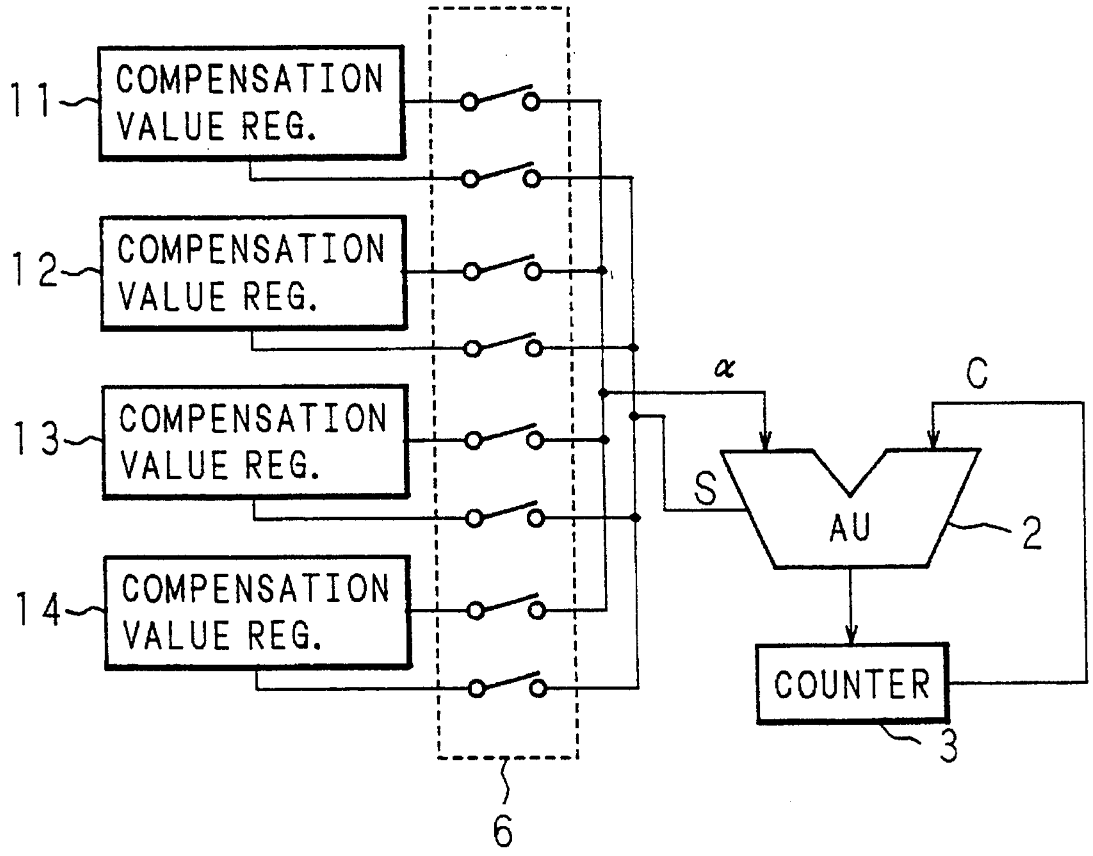
FIG. 12 is a block diagram showing a configuration of the fourth embodiment of a timer related to the present invention.

FIG. 12 is a block diagram showing a configuration example of a fourth embodiment of a timer related to the invention.

In addition, in FIG. 12, the CPU 90, the load value LV1 outputted from the CPU 90 to the counter 3, and the clock signal CLK inputted to the counter 3 are omitted for simplicity.

In the fourth embodiment, the plural compensation value registers 11, 12 . . . are provided for one arithmetic unit 2 and one counter 3, and the selection of input to the arithmetic unit 2 from these respective compensation value registers 11, 12 . . . is executed by the arithmetic unit input selector 6 controlled by the CPU 90.

Such an embodiment is effective when plural values are predictable in advance as the compensation value "α". Some values predictable as the compensation value "α" are written respectively in the compensation value registers 11, 12 . . . in advance by the CPU 90, and the count value of the counter 3 can be rewritten when the CPU 90 only controls the arithmetic unit input selector 6.

Figure 13:
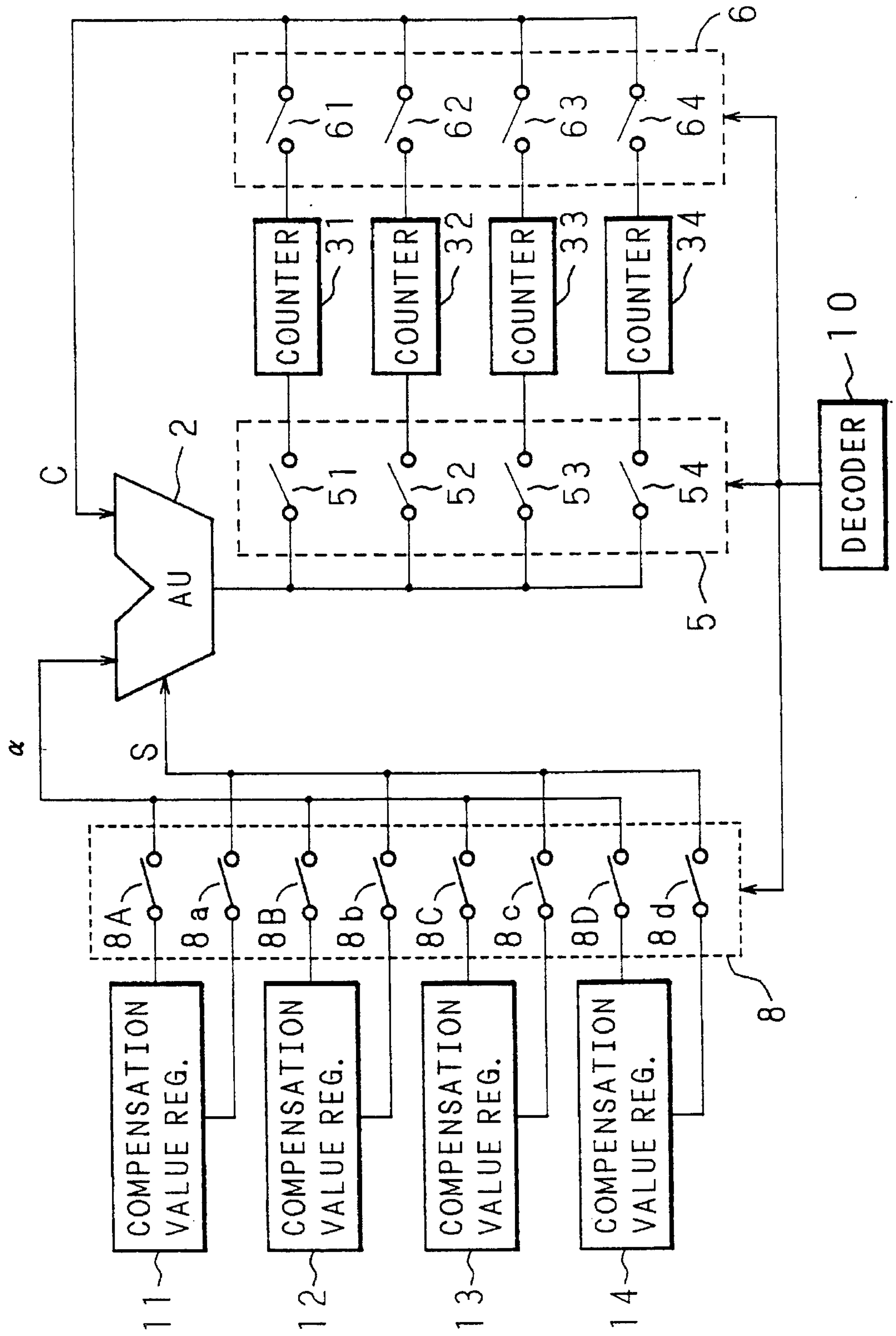
FIG. 13 is a block diagram showing a configuration of the fifth embodiment of a timer related to the present invention.

FIG. 13 is a block diagram showing a configuration example of a fifth embodiment of a timer related to the invention.

In addition, the CPU 90, the load value LV1 outputted from the CPU 90 to the counter 3 and the clock signal CLK inputted to the counter 3 are omitted for simplicity.

In the fifth embodiment, the plural compensation value registers 11, 12 . . . and the plural counters 31, 32 . . . are provided for one arithmetic unit 2, and the selection of input to the arithmetic unit 2 from these respective compensation value registers 11, 12 . . . , that is, compensation value "α" and the sign bit S, is executed by the decoder 10 controlled by the CPU 90.

Specifically, a compensation value output selector 8 for selecting which compensation value register 11, 12 . . . is connected to the arithmetic unit 2, and the counter input selector 5 and the arithmetic unit input selector 6 for selecting which counter 31, 32 . . . is connected to the arithmetic unit 2.

The compensation value output register 8 is, specifically, configured by switches 8A and 8*a*, 8B and 8*b*, . . . , each corresponding to a plurality compensation value register 11, 12 . . . respectively. In addition, the switches 8A, 8B . . . are provided for outputting the compensation value "α" from each compensation value register 11, 12 . . . , and the switches 8*a*, 8*b* . . . are provided for outputting the sign bit S from each compensation value register 11, 12 . . . Further, each switches 8A and 8*a*, 8B and 8*b* . . . of the compensation value output register 8 is controlled by the decoder 10 so as to simultaneously turn ON/OFF respectively.

The counter input selector 5 is, specifically, configured by switches 51, 52 . . . each corresponding to a plurality of counter 31, 32 . . . respectively. The arithmetic unit input selector 6 is, specifically, configured by switches 61, 62 . . . corresponding to a plurality of counter 31, 32 . . . respectively. Further, each switch 51, 52 . . . of the counter input selector 5 and each switch 61, 62 . . . of the arithmetic unit input selector 6 are controlled by the decoder 10 so that the switches 51 and 61, 52 and 62 . . . corresponding to the counter 31, 32 . . . respectively simultaneously turn ON/OFF.

Accordingly, as for the control of the respective switches 8A and 8*a*, 8B and 8*b* . . . of the selector 8, the respective switches 51, 52 . . . of the selector 5 and the respective switches 61, 62 . . . of the selector 6, data which designates any set of the compensation value register 11 and the counters 31, set of the compensation value register 12 and the counter 32, . . . is set from the CPU 90 to the decoder 10, and the switches 8A, 8*a*, 51 and 61 (or 8B, 8*b*, 52 and 62, or 8C, 8*c*, 53 and 63 . . . ) are so made as to be on at the same time according to a signal obtained by decoding the data at the decoder 10.

By such a control, the value of the counter 31 (or 32, 33 . . . ) is rewritten.

Such a configuration of the fifth embodiment has both advantages of the second embodiment shown in FIG. 9 and the fourth embodiment shown in FIG. 12. Also, since it is possible to make the respective compensation value registers 11, 12 . . . and the respective counters 31, 32, 33 . . . be a set to be constructed on an LSI, the flexibility of layout at the time of constructing an actual circuit becomes higher, and the number of the timers on the LSI can be easily changed at need.

In addition, in the aforementioned respective embodiments, as shown in FIG.6, the sign bit S of one bit is provided to the compensation value register 1, and adding or subtracting is designated to the arithmetic unit 2 according to the value of the sign bit S, however, it is proper that the arithmetic unit 2 only has an adding function when the compensation value is rewritten to the compensation value register 1 by using twos complement.

As aforementioned, according to the present invention,the configuration is such that a compensation value register for holding a compensation value outputted from a CPU and an arithmetic unit are provided, and a compensation value held by the compensation value register and a count value of a timer are added or subtracted at the arithmetic unit so that the resultant value is to be directly loaded to a counter as the count value after that time pint, therefore it is not necessary for the CPU to execute calculation for compensating the count value. Accordingly, the burden of the CPU can be lightened and an exact time-counting compensation is enabled regardless of a remaining time.

And according to the second embodiment, since the configuration is such that only one compensation value register and one arithmetic unit are provided for plural counters, in the case where the plural timers are used for a common purpose, therefore it becomes possible to produce the hardware quantity in comparison with the number of timers.

Moreover, according to the third embodiment, the configuration is such that only one compensation value register is provided and arithmetic units and counters are made to be a set one by one, thereby the flexibility in the aspect of layout on a chip is improved and the number of timers on an LSI can be changed easily at need.

Furthermore, according to the fourth embodiment, the configuration is such that plural compensation value registers are provided for one arithmetic unit and one counter, thereby the burden of the CPU in the aspect of the software is more reduced when a predictable compensation value is held in the respective compensation value registers.

Furthermore, according to the fifth embodiment, since it is possible to make the respective compensation value registers sand the respective counters be a set to be constructed on an LSI, the flexibility of layout at the time of constructing an actual circuit becomes higher, and the number of the timers on the LSI can be easily changed at need.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A timer which time-counts by loading an initial value to a counter and making said counter count to a predetermined value from said initial value, and which can extend or shorten a time-counting value by increasing or decreasing a count value of said counter by adding an optional compensation value to or subtracting an optional compensation value from the count value of said counter during the counting operation of said counter, the timer comprising:

controlling means for generating a compensation value during a counting operation of said counter;

holding means for holding the compensation value generated by said controlling means; and operating means for adding or subtracting with the compensation value held in said holding means as an addend or a subtrahend, wherein the count value of said counter is increased or decreased when said operating means adds or subtracts the compensation value held in said holding means and the count value of said counter at that time and loads the result to said counter as the count value thereof and the compensation value having a sign bit for controlling said operating means to perform an addition or a subtraction of the count value.

2. The timer of claim 1, wherein the compensation value generated by said controlling means includes a plurality of bits representing the period to be compensated, and said holding means has a first area for holding said sign bit of the compensation value generated by said controlling means and a second area for holding said plurality of bits of the same.

3. A timer which time-counts by loading an initial value to a counter and making said counter count to a predetermined value from said initial value, and which can extend or shorten a time-counting value by increasing or decreasing a count value of said counter by adding an optional compensation value to or subtracting an optional compensation value from the count value of said counter during the counting operation of said counter, the timer comprising:

a plurality of counters;

controlling means for designating one of said counters, and for generating a compensation value during counting operation of the designated counter;

holding means for holding the compensation value generated by said controlling means;

operating means for adding or subtracting with the compensation value held in said holding means as an addend or a subtrahend; and selecting means for selectively connecting the counter designated by said controlling means with said operating means, wherein the count value of the counter designated by said controlling means is increased or decreased when said operating means adds or subtracts the compensation value held in said holding means and the count value of the counter connected with said operating means by said connecting means at that time and loads the result to the counter connected with said operating means as the count value thereof.

4. The timer of claim 3, wherein the compensation value generated by said controlling means is composed of a sign bit of one bit and a plurality of bits representing the period to be compensated, said holding means has a first area for holding said sign bit of the compensation value generated by said controlling means and a second area for holding said plurality of bits of the same, and said operating means executes addition or subtraction according to said sign bit held in said first area of said holding means.

5. The timer of claim 3, wherein said selecting means comprises:

plural switching means for connecting each counter with said operating means respectively; and switch controlling means for selectively controlling one of switching means which connects the counter designated by said controlling means with said operating means to be at an on state.

6. The timer of claim 3, wherein said selecting means comprises:

plural switching means each for connecting each counter with said operating means respectively;

plural switch controlling means each for on/off controlling each switching means respectively; and select controlling means for making the switch controlling means, which on/off controls the counter designated by said controlling means, control to be at an on state and the other switch controlling means control to be at an off state.

7. A timer which time-counts by loading an initial value to a counter and making said counter count to a predetermined value from said initial value, and which can extend or shorten a time-counting value by increasing or decreasing a count value of said counter by adding an optional compensation value to or subtracting an optional compensation value from the count value of said counter during the counting operation of said counter, the timer comprising:

a plurality of counters;

controlling means for designating one of counters, and for generating a compensation value during counting operation of the designated counter;

holding means for holding the compensation value generated by said controlling means;

a plurality of operating means, each connected to each of said plurality of counters respectively, for adding or subtracting with the compensation value held in said holding means as an addend or a subtrahend; and selecting means for selectively connecting the operating means, which is connected with the counter designated by said controlling means, with said holding means, wherein the count value of the counter designated by said controlling means is increased or decreased when the operating means which is connected with said holding means by said selecting means adds or subtracts the compensation value held in said holding means and the count value of the counter connected with itself at that time and loads the result to the counter connected with itself as the count value thereof.

8. The timer of claim 7, wherein the compensation value generated by said controlling means is composed of a sign bit of one bit and a plurality of bits representing the period to be compensated, said holding means has a first area for holding said sign bit of the compensation value generated by said controlling means and a second area for holding said plurality of bits of the same, and said operating means executes addition or subtraction according to said sign bit held in said first area of said holding means.

9. A timer which time-counts by loading an initial value to a counter and making said counter count to a predetermined value from said initial value, and which can extend or shorten a time-counting value by increasing or decreasing a count value of said counter by adding an optional compensation value to or subtracting an optional compensation value from the count value of said counter during the counting operation of said counter, comprising:

a plurality of holding means, each for holding a compensation value different from each other;

controlling means for designating one of said holding means, and for generating a plurality of compensation values different from each other to hold them in each said holding means respectively;

operating means for adding or subtracting with the compensation value held in one of said plurality of holding means as an addend or a subtrahend; and selecting means for selectively connecting the holding means designated by said controlling means with said operating means, wherein the count value of said counter is increased or decreased when said operating means adds or subtracts the compensation value held in the holding means designated by said controlling means and the count value of said counter at that time and loads the result to said counter as the count value thereof, and the compensation value has a sign bit for controlling the operating means to perform an addition or a subtraction of the count value.

10. The timer of claim 9, wherein the compensation value generated by said controlling means includes a plurality of bits representing the period to be compensated, and each of said holding means has a first area for holding said sign bit of the compensation value generated by said controlling means and a second area for holding said plurality of bits of the same.

11. A timer which time-counts by loading an initial value to a counter and making said counter count to a predetermined value from said initial value, and which can extend or shorten a time-counting value by increasing or decreasing a count value of said counter by adding an optional compensation value to or subtracting an optional compensation value from the count value of said counter during the counting operation of said counter, comprising:

a plurality of holding means, each for holding a compensation value different from each other;

a plurality of counters;

controlling means for designating one of said plural holding means and one of said plural counters as a set, and for generating a plurality of compensation values different from each other to hold them in each of said plurality of said holding means respectively;

operating means for, which is connected to respective said plurality of counters, adding or subtracting with the compensation value held in one of said plurality of holding means as an addend or a subtrahend; and selecting means for selectively connecting the counter and the holding means designated by said controlling means as a set with said operating means, wherein the count value of the counter designated by said controlling means is increased or decreased when said operating means adds or subtracts the compensation value held in the holding means designated by said controlling means and the count value of said counter at that time and loads the result to said counter as the count value thereof.

12. The timer of claim 11, wherein the compensation value generated by said controlling means is composed of a sign bit of one bit and a plurality of bits representing the period to be compensated, each of said holding means has a first area for holding said sign bit of the compensation value generated by said controlling means and a second area for holding said plurality of bits of the same, and said operating means executes addition or subtraction according to said sign bit held in said first area of said holding means.

13. A timer which time-counts by loading an initial value to a counter and making said counter count to a predetermined value from said initial value, and which can extend or shorten a time-counting value by increasing or decreasing a count value of said counter by adding an optional compensation value to or subtracting an optional compensation value from the count value of said counter during the counting operating of said counter, the timer comprising:

controlling means for generating a compensation value during a counting operation of said counter, said compensation value having a plurality of bits representing the period to be compensated and a sign bit of one bit;

holding means for holding the compensation value generated by said controlling means, said holding means having a first area for holding said sign bit of the compensation value generated by said controlling means and a second area for holding said plurality of bits of the same; and operating means for adding or subtracting with the compensation value held in said holding means as an addend or a subtrahend, wherein the count value of said counter is increased or decreased when said operating means adds or subtracts the compensation value held in said holding means and the count value of said counter at that time and loads the result to said counter as the count value thereof, and said operating means performs an addition or a subtraction of the count value according to said sign bit held in said first area of said holding means.

14. A timer which time-counts by loading an initial value to a counter and making said counter count to a predetermined value from said initial value, and which can extend or shorten a time-counting value by increasing or decreasing a count value of said counter by adding an optional compensation value to or subtracting an optional compensation value from the count value of said counter during the counting operation of said counter, comprising:

a plurality of holding means, each for holding a compensation value different from each other;

controlling means for designating one of said holding means, and for generating a plurality of compensation values different from each other to hold them in each said holding means respectively, each compensation value having a plurality of bits representing the period to be compensated and a sign bit of one bit;

operating means for adding or subtracting with the compensation value held in one of said plurality of holding means as an addend or a subtrahend; and selecting means for selectively connecting the holding means designated by said controlling means with said operating means, wherein the count value of said counter is increased or decreased when said operating means adds or subtracts the compensation value held in the holding means designated by said controlling means and the count value of said counter at that time and loads the result to said counter as the count value thereof, each of said holding means has a first area for holding said sign bit of the compensation value generated by said controlling means and a second area for holding said plurality of bits of the same, and said operating means performs an addition or a subtraction of the count value according to said sign bit held in said first area of said holding means.

* * * * *